(12) United States Patent
Bhalla et al.

(10) Patent No.: US 8,928,079 B2
(45) Date of Patent: Jan. 6, 2015

(54) MOS DEVICE WITH LOW INJECTION DIODE

(75) Inventors: Anup Bhalla, Santa Clara, CA (US); Xiaobin Wang, San Jose, CA (US); Ji Pan, San Jose, CA (US); Sung-Po Wei, San Jose, CA (US)

(73) Assignee: Alpha and Omega Semiconductor Limited (BM)

( * ) Notice: Subject to any disclaimer, the term of this patent is extended or adjusted under 35 U.S.C. 154(b) by 0 days.

(21) Appl. No.: 13/610,758

(22) Filed: Sep. 11, 2012

(65) Prior Publication Data

US 2013/0009242 A1    Jan. 10, 2013

Related U.S. Application Data

(63) Continuation of application No. 12/005,130, filed on Dec. 21, 2007, now Pat. No. 8,283,723, which is a continuation-in-part of application No. 11/900,616, filed on Sep. 11, 2007, now Pat. No. 7,605,425, which is a continuation of application No. 11/056,346, filed on Feb. 11, 2005, now Pat. No. 7,285,822.

(51) Int. Cl.
| | |
|---|---|
| *H01L 29/66* | (2006.01) |
| *H01L 29/10* | (2006.01) |
| *H01L 29/78* | (2006.01) |
| *H01L 21/265* | (2006.01) |
| *H01L 29/06* | (2006.01) |
| *H01L 29/165* | (2006.01) |
| *H01L 29/417* | (2006.01) |
| *H01L 29/423* | (2006.01) |
| *H01L 29/45* | (2006.01) |
| *H01L 29/47* | (2006.01) |

(52) U.S. Cl.
CPC ...... *H01L 29/1095* (2013.01); *H01L 29/66727* (2013.01); *H01L 29/66734* (2013.01); *H01L 29/7806* (2013.01); *H01L 29/7811* (2013.01); *H01L 29/7813* (2013.01); *H01L 21/26586* (2013.01); *H01L 29/0623* (2013.01); *H01L 29/165* (2013.01); *H01L 29/41766* (2013.01); *H01L 29/4236* (2013.01); *H01L 29/456* (2013.01); *H01L 29/47* (2013.01)
USPC ............................ 257/341; 257/E21.418

(58) Field of Classification Search
USPC ........... 257/330–332, 339, 341, E21.418, 257/E21.419; 438/259, 270, 428
See application file for complete search history.

(56) References Cited

U.S. PATENT DOCUMENTS

| | | | | |
|---|---|---|---|---|
| 5,489,787 A | * | 2/1996 | Amaratunga et al. | 257/137 |
| 5,489,797 A | * | 2/1996 | Chan et al. | 257/382 |

(Continued)

*Primary Examiner* — Matthew W Such
*Assistant Examiner* — Ali Naraghi
(74) *Attorney, Agent, or Firm* — Van Pelt, Yi & James LLP

(57) ABSTRACT

A semiconductor device is formed on a semiconductor substrate. The device includes: a drain; an epitaxial layer overlaying the drain, wherein a drain region extends into the epitaxial layer; and an active region. The active region includes: a body disposed in the epitaxial layer, having a body top surface; a source embedded in the body, extending from the body top surface into the body; a gate trench extending into the epitaxial layer; a gate disposed in the gate trench; an active region contact trench extending through the source and into the body; and an active region contact electrode disposed within the active region contact trench. A layer of body region separates the active region contact electrode from the epitaxial layer, and a low injection diode is formed below a body/drain junction.

22 Claims, 17 Drawing Sheets

(56) References Cited

U.S. PATENT DOCUMENTS

| | | | |
|---|---|---|---|
| 6,433,396 B1* | 8/2002 | Kinzer | 257/369 |
| 6,686,814 B2* | 2/2004 | Chiu et al. | 333/164 |
| 7,564,097 B2* | 7/2009 | Ono et al. | 257/330 |
| 7,667,264 B2* | 2/2010 | Tai et al. | 257/330 |
| 2004/0012050 A1* | 1/2004 | Uno et al. | 257/330 |
| 2005/0029584 A1* | 2/2005 | Shiraishi et al. | 257/329 |
| 2005/0167742 A1* | 8/2005 | Challa et al. | 257/328 |
| 2006/0138533 A1* | 6/2006 | Hirler et al. | 257/330 |
| 2006/0209887 A1* | 9/2006 | Bhalla et al. | 370/466 |
| 2006/0273385 A1 | 12/2006 | Hshieh | |
| 2007/0278565 A1* | 12/2007 | Tu et al. | 257/330 |

\* cited by examiner

MOS DEVICE WITH LOW INJECTION DIODE

CROSS REFERENCE TO OTHER APPLICATIONS

This application is a continuation of co-pending U.S. patent application Ser. No. 12/005,130, entitled MOS DEVICE WITH LOW INJECTION DIODE filed Dec. 21, 2007 which is incorporated herein by reference for all purposes, which is a continuation in part of U.S. patent application Ser. No. 11/900,616 entitled POWER MOS DEVICE filed Sep. 11, 2007, now U.S. Pat. No. 7,605,425, which is incorporated herein by reference for all purposes, and which is a continuation of U.S. patent application Ser. No. 11/056,346 entitled POWER MOS DEVICE filed Feb. 11, 2005, now U.S. Pat. No. 7,285,822, which is incorporated herein by reference for all purposes.

BACKGROUND OF THE INVENTION

Power MOS devices are commonly used in electronic circuits. Depending on the application, different device characteristics may be desirable. One example application is a DC-DC converter, which includes a power MOS device as a synchronous rectifier (also referred to as the low side FET) and another power MOS device as a control switch (also referred to as the high side FET). The low side FET typically requires a small on-resistance to achieve good power switch efficiency. The high side FET typically requires a small gate capacitance for fast switching and good performance.

The value of a transistor's on-resistance ($R_{dson}$) is typically proportional to the channel length (L) and inversely proportional to the number of active cells per unit area (W). When choosing a value for $R_{dson}$, consideration should be given to the tradeoff between performance and breakdown voltage. To reduce the value of $R_{dson}$, the channel length can be reduced by using shallower source and body, and the number of cells per unit area can be increased by reducing the cell size. However, the channel length L is typically limited because of the punch-through phenomenon. The number of cells per unit area is limited by manufacturing technology and by the need to make a good contact to both the source and body regions of the cell. As the channel length and the cell density increase, gate capacitance also increases. Lower device capacitance is preferred for reduced switching losses. In some applications such as synchronous rectification, the stored charge and forward drop of the body diode also result in efficiency loss. These factors together tend to limit the performance of DMOS power devices.

It would be desirable if the on-resistance and the gate capacitance of DMOS power devices could be reduced from the levels currently achievable, so that the reliability and power consumption of the power switch could be improved. It would also be useful to develop a practical process that could reliably manufacture the improved DMOS power devices.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A metal oxide semiconductor (MOS) device and its fabrication are described. For the purpose of example, N-channel devices with source and drain made of N-type material and body made of P-type material are discussed in detail throughout this specification. The techniques and structures disclosed herein are also applicable to P-channel devices.

Figure 1A:
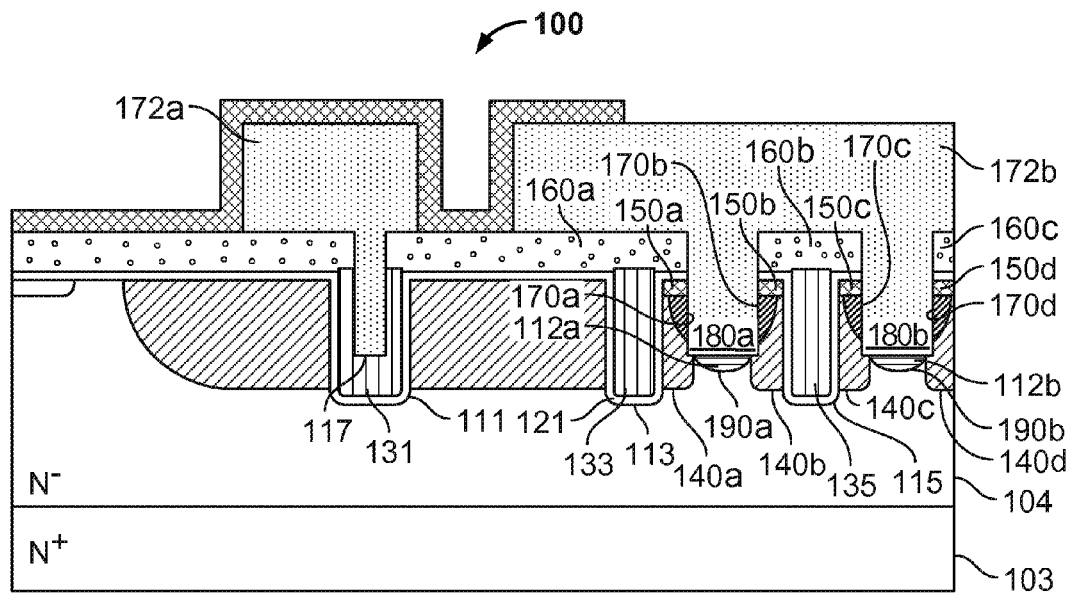
FIGS. 1A-1F illustrate several double-diffused metal oxide semiconductor (DMOS) device embodiments.

FIGS. 1A-1F illustrate several double-diffused metal oxide semiconductor (DMOS) device embodiments. FIG. 1A is a cross sectional view of an embodiment of a DMOS device. In this example, device 100 includes a drain that is formed on the back of an $N^+$-type semiconductor substrate 103. The drain region extends into an epitaxial (epi) layer 104 of $N^-$-type semiconductor that overlays substrate 103. Gate trenches such as 111, 113, and 115 are etched in epi layer 104. A gate oxide layer 121 is formed inside the gate trenches. Gates 131, 133 and 135 are disposed inside gate trenches 111, 113 and 115, respectively, and are insulated from the epi layer by the oxide layer. The gates are made of a conductive material such as polycrystalline silicon (poly) and the oxide layer is made of an insulating material such as thermal oxide. Specifically gate trench 111 is located in a termination region disposed with a gate runner 131 for connection to gate contact metal. For that purpose gate runner trench 111 may be wider and deeper compared to active gate trenches 113 and 115. Further the spacing between the gate runner trench 111 from the active trench next to it, in this case trench 113, may be larger than the spacing between the active gate trenches 113 and 115.

Source regions 150a-d are embedded in body regions 140a-d, respectively. The source regions extend downward from the top surface of the body into the body itself. While body regions are implanted along side of all gate trenches, source regions are only implanted next to active gate trenches and not gate runner trenches. In the embodiment shown, gates such as 133 have a gate top surface that extends substantially above the top surface of the body where the source is embedded. Such a configuration guarantees the overlap of the gate and the source, allowing the source region to be shallower than the source region of a device with a recessed gate, and increases device efficiency and performance. The amount by which the gate poly top surface extends above the source-body junction may vary for different embodiments. In some embodiments, the gates of the device do not extend above the top surface of the source/body region, rather recess from the top surface of the source/body region.

During operation, the drain region and the body regions together act as a diode, referred to as the body diode. A dielectric material layer 160 is disposed over the gate to insulate the gate from source-body contact. The dielectric material forms insulating regions such as 160a-c on top of the gates as well as on top of the body and source regions. Appropriate dielectric materials include thermal oxide, low temperature oxide (LTO), boro-phospho-silicate glass (BPSG), etc.

A number of contact trenches 112a-b are formed between the active gate trenches near the source and body regions. These trenches are referred to as active region contact trenches since the trenches are adjacent to the device's active region that is formed by the source and body regions. For example, contact trench 112a extends through the source and the body, forming source regions 150a-b and body regions 140a-b adjacent to the trench. In contrast, trench 117, which is formed on top of gate runner 131, is not located next to an active region, and therefore is not an active region contact trench. Trench 117 is referred to as a gate contact trench or gate runner trench since a metal layer 172a connected to the gate signal is deposited within the trench. Gate signal is fed to active gates 133 and 135 through interconnections between trenches 111, 113 and 115 in the third dimension (not shown). Metal layer 172a is separated from metal layer 172b, which connects to source and body regions through contact trenches 112a-b to supply a power source. In the example shown, the active region contact trenches and gate contact trench have approximately the same depth.

Device 100 has active region contact trenches 112a-b that are shallower than the body. This configuration provides good breakdown characteristics as well as lower resistance and leakage current. Additionally, since the active contact trenches and gate contact trench are formed using a one step process therefore have the same depth, having active contact trenches that are shallower than the body prevents the gate runner such as 131 from being penetrated by the gate contact trench.

In the example shown, the FET channel is formed along the active region gate trench sidewall between the source/body and body/drain junctions. In a device with a short channel region, as the voltage between the source and the drain increases, the depletion region expands and may eventually reach the source junction. This phenomenon, referred to as punch through, limits the extent to which the channel may be shortened. In some embodiments, to prevent punch through, regions such as 170a-d along the walls of the active region contact trench are heavily doped with P type material to form $P^+$-type regions. The $P^+$-type regions prevent the depletion region from encroaching upon the source region. Thus, these implants are sometimes referred to as anti-punch through implants or punch through prevention implants. In some embodiments, to achieve pronounced anti-punch through effects, the $P^+$ regions are disposed as close as possible to the channel region and/or as close as it is allowed by manufacturing alignment capability and $P^+$ sidewall dopant penetration control. In some embodiments, the misalignment between the trench contact and the trench is minimized by self-aligning the contact, and the trench contact is placed as closely centered between the trenches as possible. These structural enhancements allow the channel to be shortened such that the net charge in the channel per unit area is well below the minimum charge needed to prevent punch through in an ideal unprotected structure. In addition to improving body contact resistance, the anti-punch through implants also makes it possible to construct very shallow trench short-channel devices. In the embodiment shown, contact trenches 112a-b are shallower than body regions 140a-d and do not extend all the way through the body regions. The device's on-resistance $R_{dson}$ as well as the gate capacitance are reduced.

A conductive material is disposed in contact trenches 112a-b as well as gate trench 117 to form contact electrodes. In the active region, since the punch-through implants are disposed along the sidewalls of the contact trenches but not along the bottoms of the contact trenches, the contact electrodes are in contact with $N^-$ drain region 104. Together, the contact electrodes and the drain region form Schottky diodes that are in parallel with the body diode. The Schottky diodes reduce the body diode forward drop and minimize the stored charge, making the MOSFET more efficient. A single metal that is capable of simultaneously forming a Schottky contact to the $N^-$ drain and forming good Ohmic contact to the $P^+$ body and $N^+$ source is used to form electrodes 180a-b. Metals such as titanium (Ti), platinum (Pt), palladium (Pd), tungsten (W) or any other appropriate material may be used. In some embodiments, metal layer 172 is made of aluminum (Al) or made of a Ti/TiN/Al stack.

The leakage current of the Schottky diode is related to the Schottky barrier height. As the barrier height increases, the leakage current decreases, and the forward drop voltage also increases. In the example shown, optional Schottky barrier controlling layers 190a-b (also known as Shannon layers) are formed below the contact electrode, by implanting thing layers of dopants around the bottoms of active region trenches 112a-b. The dopants have opposite polarity as the epi layer and are of P type in this example. The Shannon implant is shallow and low dosage; therefore, it is completely depleted regardless of bias. The Schottky barrier controlling layer is used to control the Schottky barrier height, thus allowing for better control over the leakage current and improving the reverse recovery characteristics of the Schottky diode. Details of the formation of the Schottky barrier controlling layer are described below.

Figure 1B:
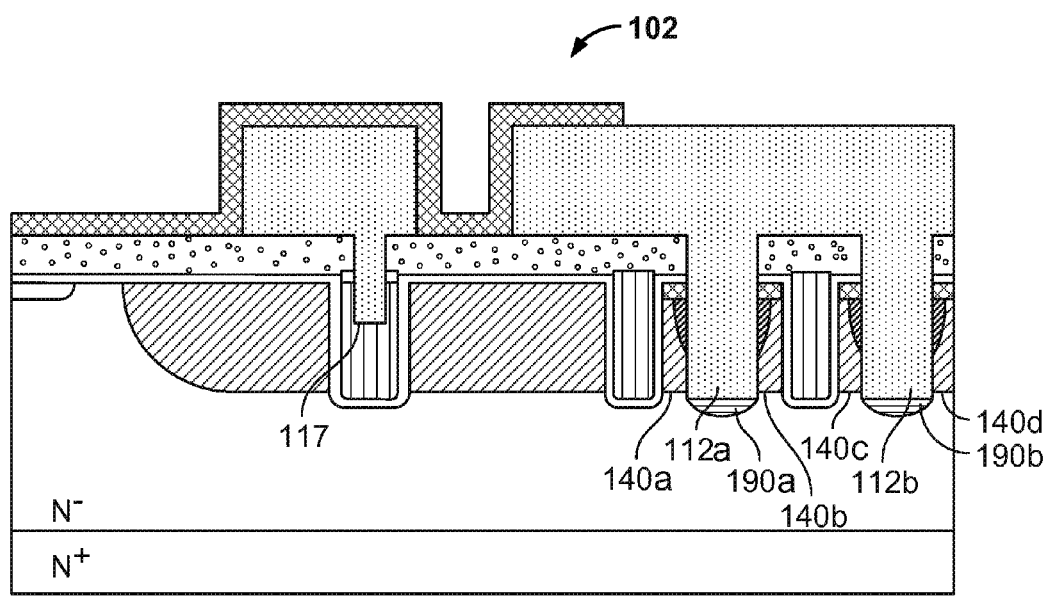

FIG. 1B is a cross sectional view of another embodiment of a DMOS device. Device 102 also includes Schottky barrier controlling layers 190a-b around the bottoms of the active region contact trenches. In this example, the depth of gate contact trench 117 is different from that of active region contact trenches 112-b. The active region contact trenches are deeper than body regions 140a-d and extend beyond the body regions. Since the active contact trench is deeper, it provides more area for making Ohmic contact along the sidewalls and results in better unclamped inductive switching (UIS) capability. Furthermore, by making the gate contact trench shallower than the active contact trenches, it is unlikely that the gate contact trench would penetrate the gate runner poly during the etching process, which is useful for devices with relatively shallow gate polys (such as devices fabricated using processes that result in gate polys that do not extend above the body top surface).

Figure 1C:
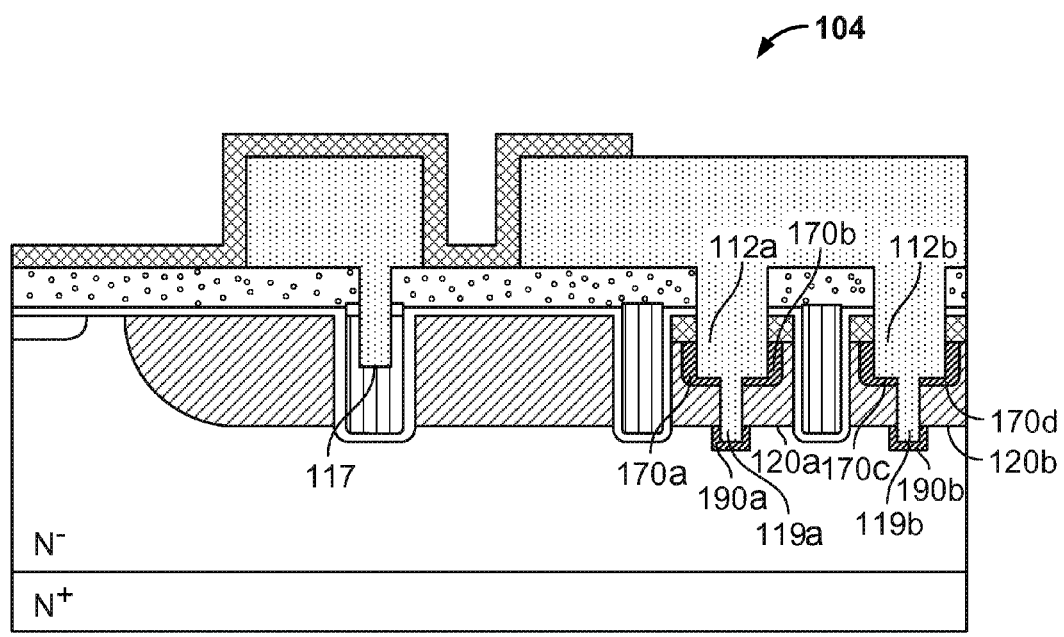

FIG. 1C is another embodiment of a DMOS device. In this example, gate contact trench 117 and active region contact trenches 112a-b have different depths. Further, the depth of each of the active region contact trenches is non-uniform since the trench depth varies in the direction parallel to the substrate surface. As will be described in more detail below, the active region contact trenches are formed using a 2-step process, resulting in a first contact opening (e.g. 120a-b) that is wider than a second contact opening (e.g. 119a-b). The shape of the profile of the active region contact trench allows for greater Ohmic contact area and better punch-through prevention by anti-punch through implants 170a-d, and improves the device's UIS capability. Shannon implants distribute around the sidewall and bottom of the second contact opening, forming a Schottky barrier controlling layer 190a-b.

Figure 1D:
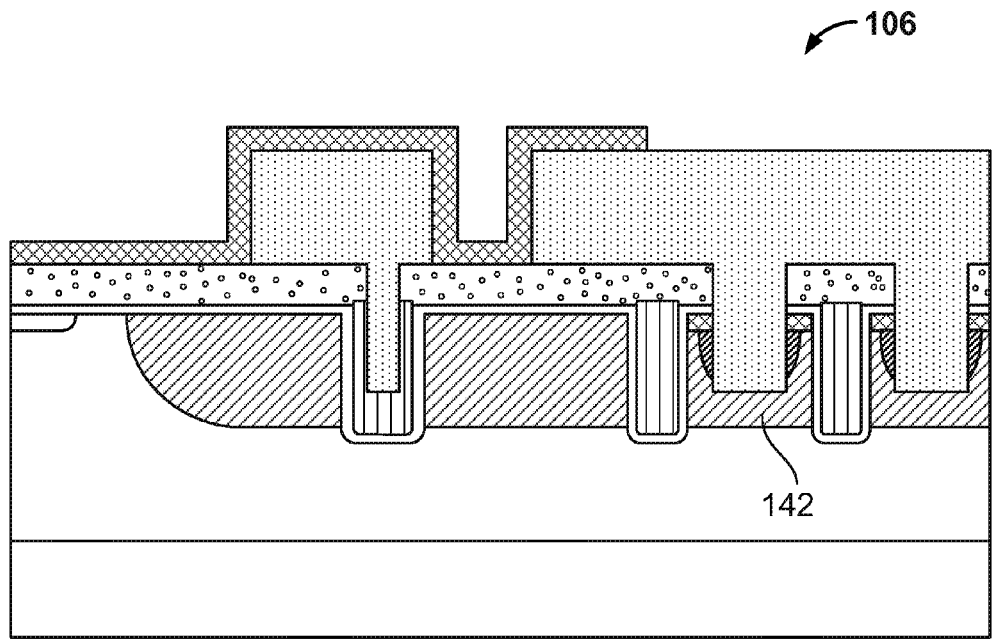
Figure 1E:
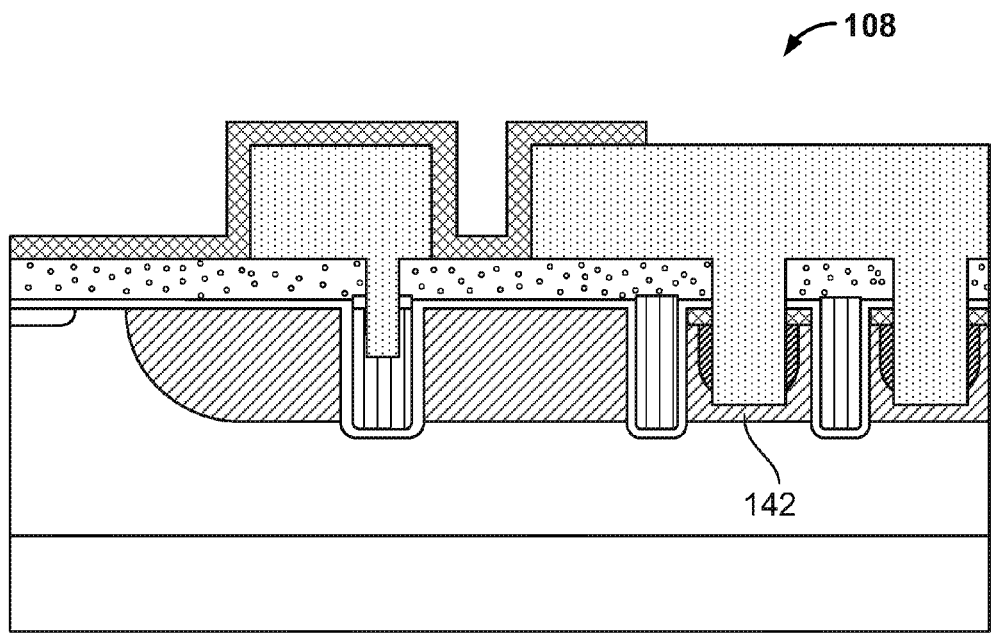
Figure 1F:
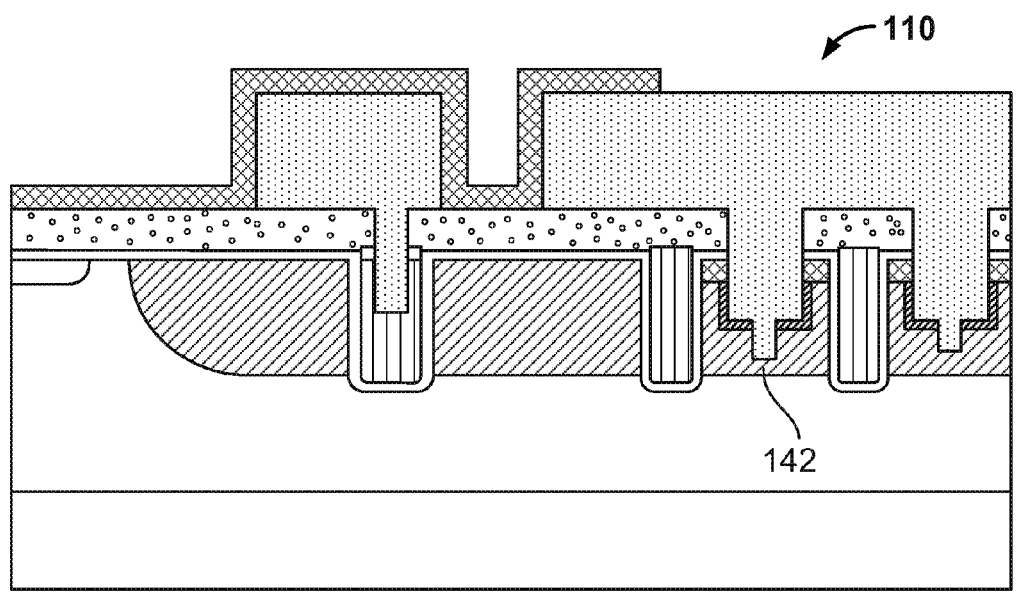

FIGS. 1D-1F illustrate embodiments of DMOS devices with integrated low injection body diode. Devices 106, 108, and 110 have active region contact trenches that are shallower than the body regions. In some embodiments, a thin layer of body region 142 separates the bottom of the active region trench from the epi, forming a low injection diode below the body/drain junction. The thickness and the doping level of the thin body layer, which lies between the active region contact trench and the drain, are adjusted so that in reverse bias this thin body layer is almost completely depleted while in forward bias the body layer is not depleted. In some embodiments, the thickness of the layer is approximately 0.01~0.5 μm. The integration of such a low injection diode in devices 106, 108 and 110 provide performance improvement over the regular body diode as carrier has been greatly reduced. With proper control of thin body layer a low injection body diode may provide comparable performance as the Schottky diode, with the advantage of simplified process as formation of Schottky barrier controlling layer can be omitted.

Figure 2:
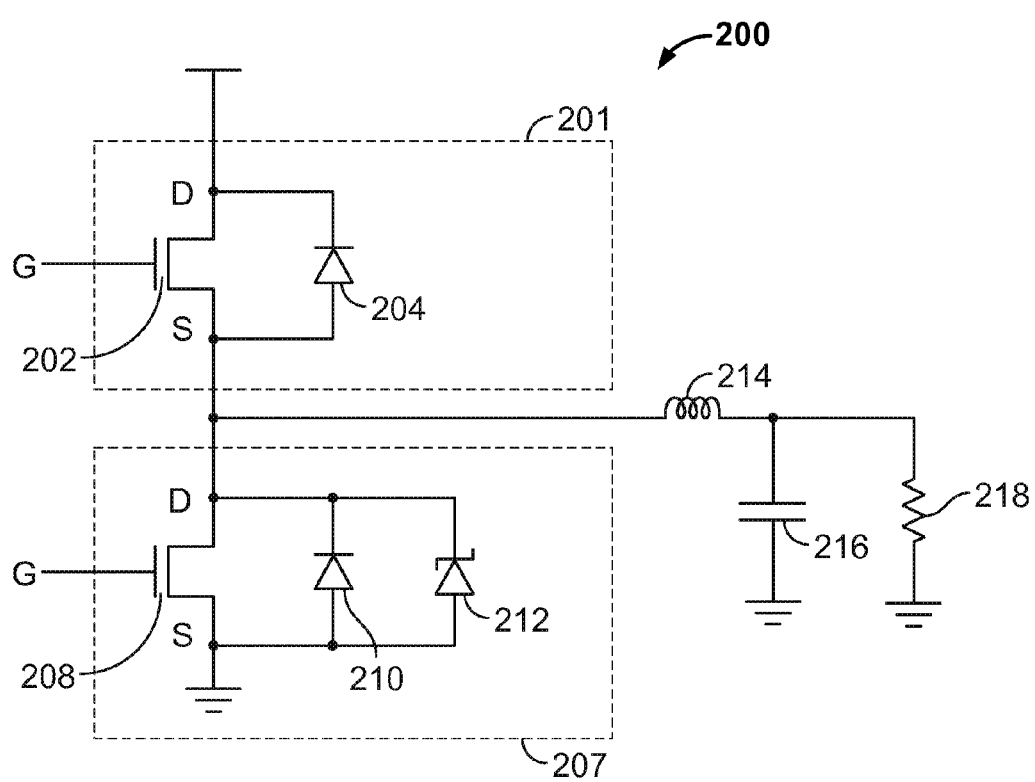
FIG. 2 is a diagram illustrating a buck converter circuit example.

FIG. 2 is a diagram illustrating a buck converter circuit example. In this example, circuit 200 is shown to employ a high side FET device 201 and a low side FET device 207. High side device 201 includes a transistor 202 and a body diode 204. Low side device 207 can be implemented using devices such as 100, 102, or 104 shown in FIGS. 1A-1F. Device 207 includes a transistor 208, a body diode 210 and a Schottky diode 212. The load includes an inductor 214, a capacitor 216 and a resistor 218. During normal operation, device 201 is turned on to transfer power from the input source to the load. This causes the current to ramp up in the inductor. When device 201 is turned off, the inductor current still flows and commutates to body diode 210 of device 207. After a short delay, the control circuit turns on device 207, which turns on the channel of transistor 208 and dramatically reduces the forward drop across the drain-source terminals of device 208. Without Schottky diode 212, the body diode conduction loss and the losses from removing the stored charge in body diode 210 of device 207 can be substantial. However, if Schottky diode 212 is built into device 207 and if the Schottky diode has a low forward drop, the conduction loss is greatly reduced. Since the low forward drop across the Schottky diode is lower than the junction drop of the body diode, no stored charge is injected while the Schottky diode conducts, further improving the losses related to diode recovery.

Figure 3:
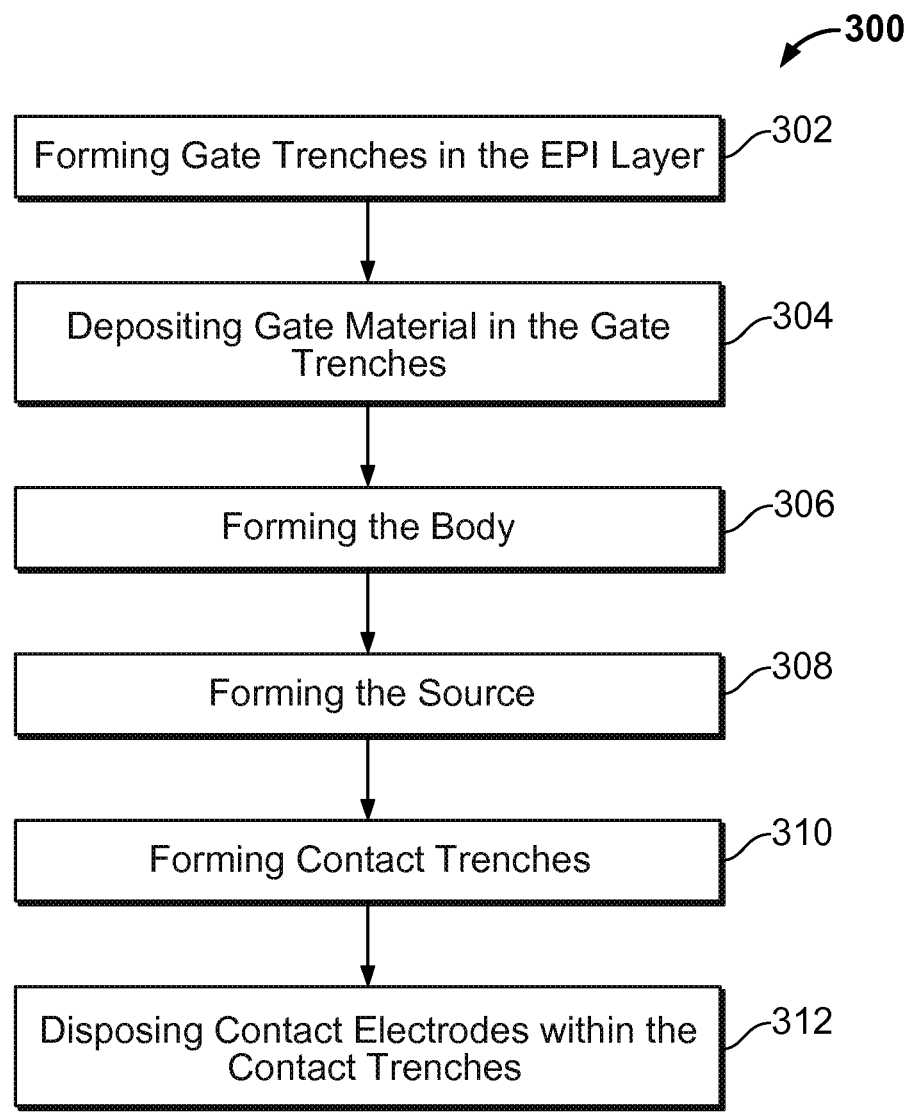
FIG. 3 is a flowchart illustrating an embodiment of a fabrication process for constructing a DMOS device.

FIG. 3 is a flowchart illustrating an embodiment of a fabrication process for constructing a DMOS device. At 302, gate trenches are formed in the epi layer overlaying the semiconductor substrate. At 304, gate material is deposited in the gate trenches. At 306 and 308, the body and the source are formed. At 310, contact trenches are formed. As will be discussed in further detail below, in some embodiments, the active region contact trenches and the gate region trenches are formed in a single step; in some embodiments, the trenches are formed in multiple steps to achieve different depth. At 312, contact electrodes are disposed within the contact trenches. Process 300 and its steps can be modified to produce different embodiments of MOS devices such as 102-110 shown in FIGS. 1A-1F.

Figure 4A:
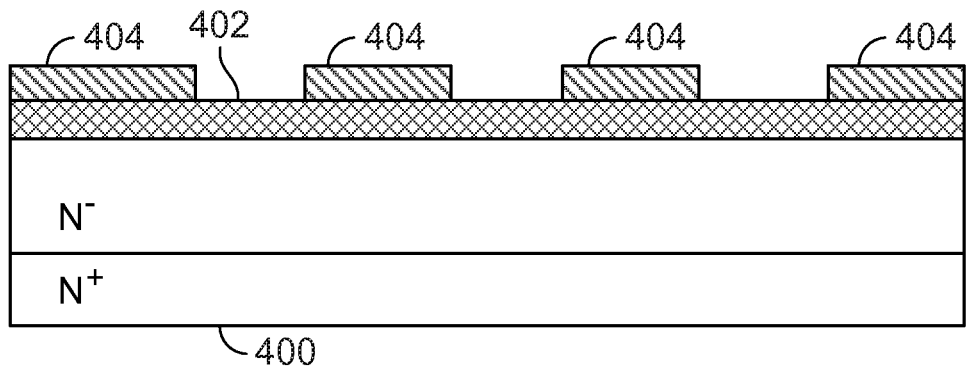
FIGS. 4A-4U are device cross-sectional views illustrating in detail an example fabrication process used for fabricating an MOS device.

FIGS. 4A-4V are device cross-sectional views illustrating in detail an example fabrication process used for fabricating an MOS device. In this example, an N type substrate (i.e., an $N^+$ silicon wafer with an $N^-$ epi layer grown on it) is used as the drain of the device.

FIGS. 4A-4J shows the formation of the gate. In FIG. 4A, a $SiO_2$ layer 402 is formed on N type substrate 400 by deposition or thermal oxidation. The thickness of the silicon oxide ranges from 100 Å to 30000 Å in various embodiments. Other thicknesses can be used. The thickness is adjusted depending on the desired height of the gate. A photoresist layer 404 is spun on top of the oxide layer and patterned using a trench mask.

Figure 4B:
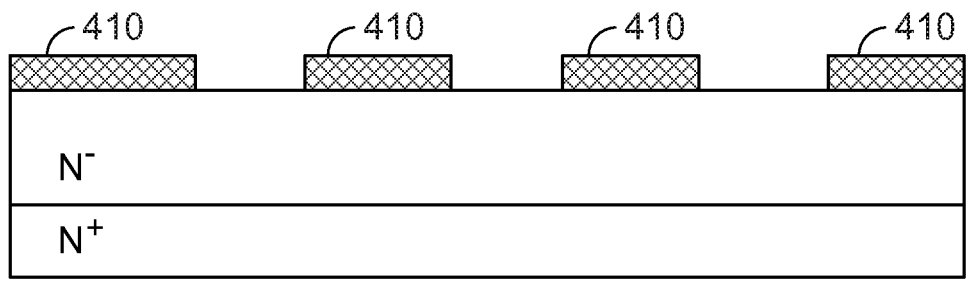
Figure 4C:
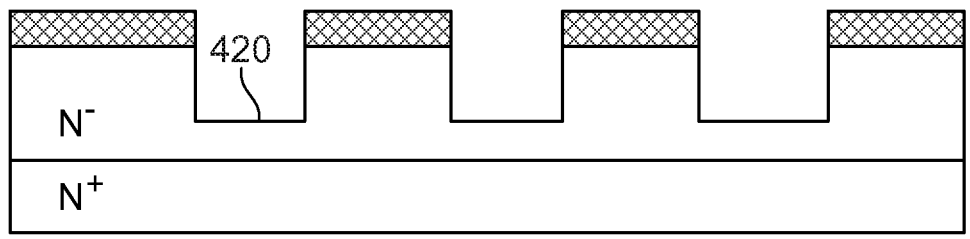
Figure 4D:
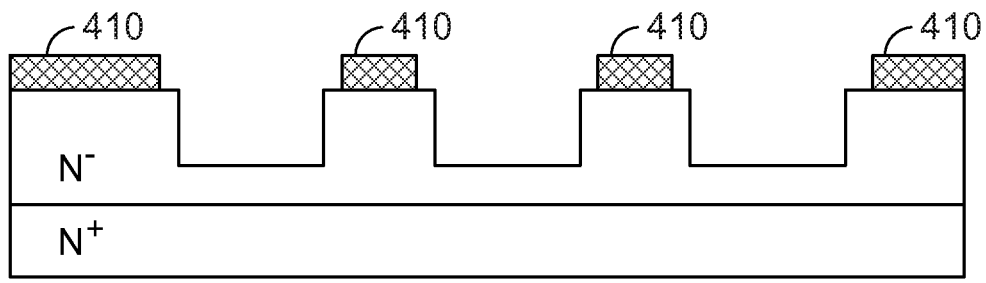

In FIG. 4B, the $SiO_2$ in the exposed areas is removed, leaving a $SiO_2$ hard mask 410 for silicon etching. In FIG. 4C, the silicon is etched anisotropically, leaving trenches such as 420. The gate material is deposited in the trenches. Gates that are later formed within the trench have sides that are substantially perpendicular to the top surface of the substrate. In FIG. 4D, $SiO_2$ hard mask 410 is etched back by an appropriate amount so that the trench walls remain approximately aligned with the edge of the hard mask after later etching steps. $SiO_2$ is the mask material used in this embodiment because etching using a $SiO_2$ hard mask leaves relatively straight trench walls that mutually align with the sides of the mask. Other material may be used as appropriate. Certain other types of material traditionally used for hard mask etching, such as $Si_3N_4$, may leave the etched trench walls with a curvature that is less desirable for gate formation in the following steps.

Figure 4E:
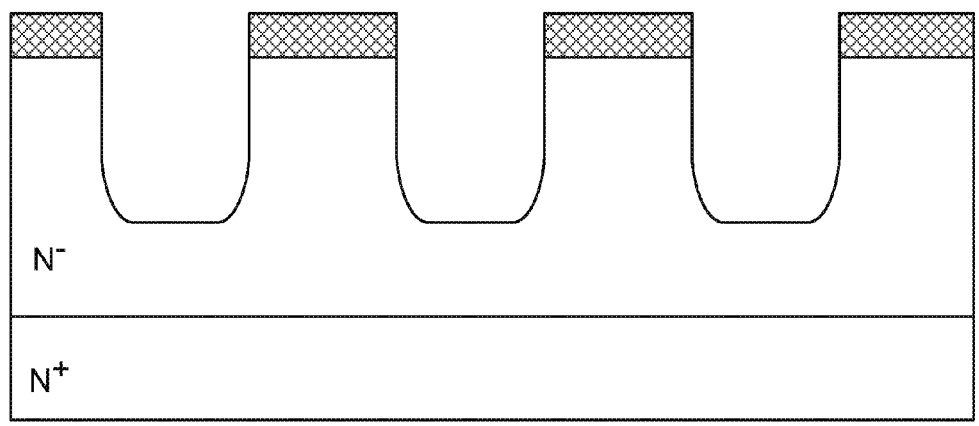
Figure 4F:
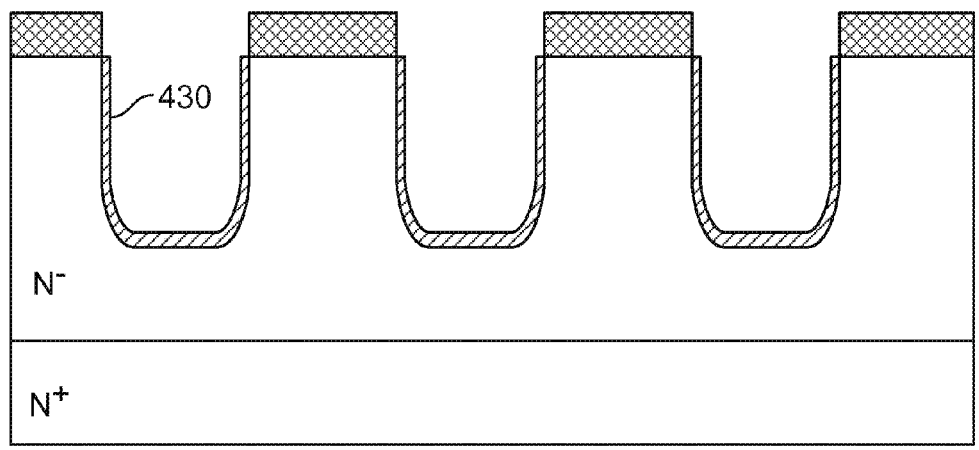
Figure 4G:
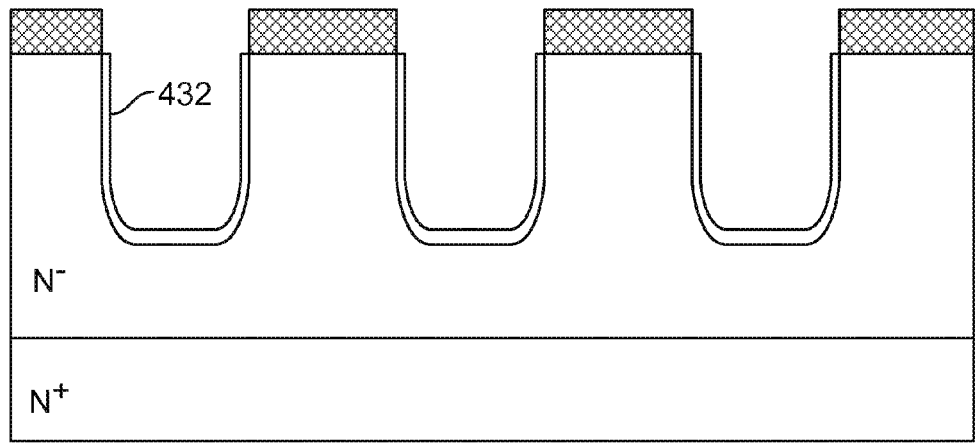

In FIG. 4E, the substrate is etched isotropically to round out the bottoms of the trenches. The trench is approximately between 0.5-2.5 μm deep and approximately between 0.2-1.5 μm wide in some embodiments; other dimensions can also be used. To provide a smooth surface for growing gate dielectric material, a sacrificial layer of $SiO_2$ 430 is grown in the trenches. This layer is then removed by the process of wet etching. In FIG. 4G, a layer of $SiO_2$ 432 is grown thermally in the trenches as dielectric material.

Figure 4H:
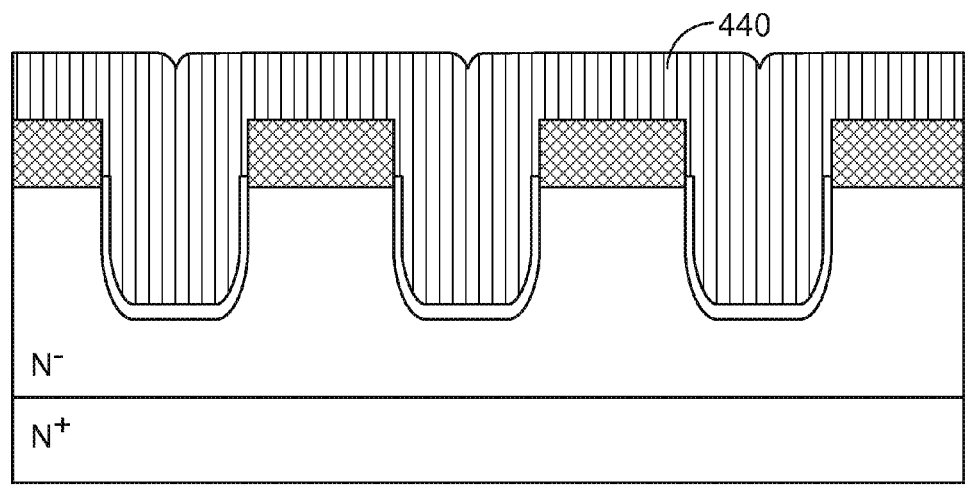
Figure 4I:
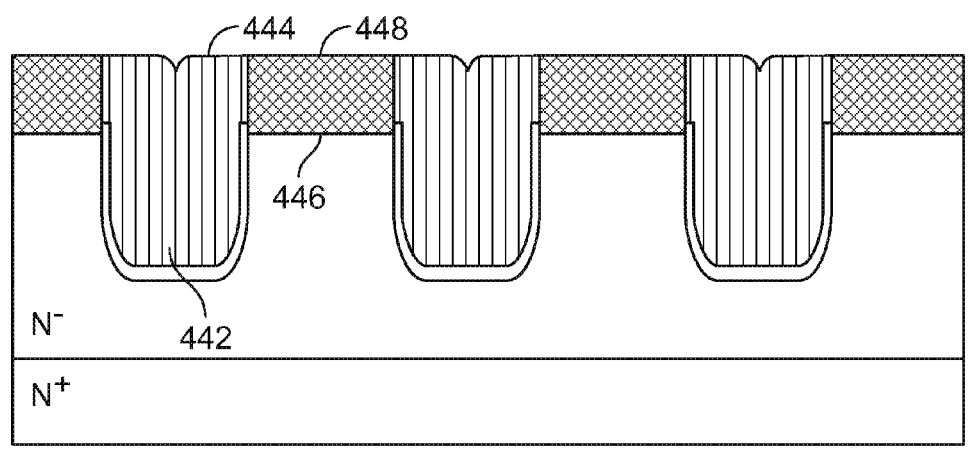
Figure 4J:
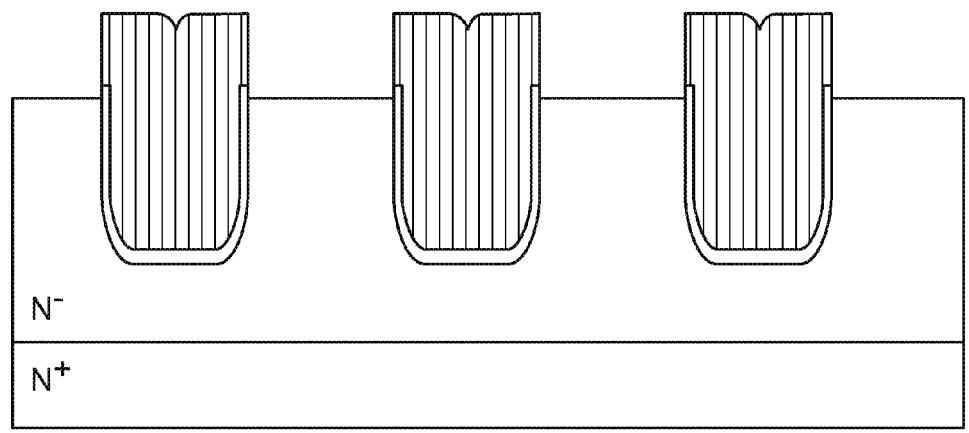

In FIG. 4H, poly 440 is deposited to fill up the trenches. In this case, the poly is doped to obtain the appropriate gate resistance. In some embodiments, doping takes place as the poly layer is deposited (in situ). In some embodiments, the poly is doped after the deposition. In FIG. 4I, the poly layer on top of the $SiO_2$ is etched back to form gates such as 442. At this point, top surface 444 of the gate is still recessed relative to top surface 448 of the $SiO_2$; however, top surface 444 of the gate may be higher than top layer 446 of the silicon, depending on the thickness of hard mask layer 410. In some embodiments, no mask is used in poly etch back. In some embodiments, a mask is used in poly etch back to eliminate the use of an additional mask in the following body implanting process. In FIG. 4J, the SiO$_2$ hard mask is removed. In some embodiments, dry etch is used for hard mask removal. The etching process stops when the top silicon surface is encountered, leaving the poly gate extending beyond the substrate surface where source and body dopants will be implanted. In some embodiments, the gate extends beyond the substrate surface by approximately between 300 Å to 20000 Å. Other values can also be used. A SiO$_2$ hard mask is used in these embodiments since it provides the desired amount of gate extension beyond the Si surface in a controllable fashion. A screen oxide may then be grown across the wafer. The above processing steps may be simplified for fabricating devices with recessed gate poly. For example, in some embodiments a photoresist mask or a very thin SiO$_2$ hard mask is used during trench formation, and thus the resulting gate poly does not extend beyond the Si surface.

Figure 4K:
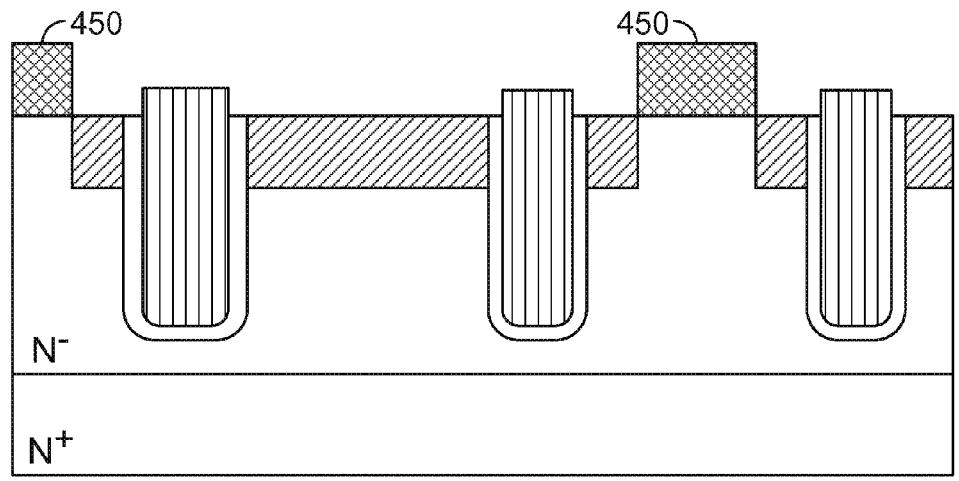
Figure 4L:
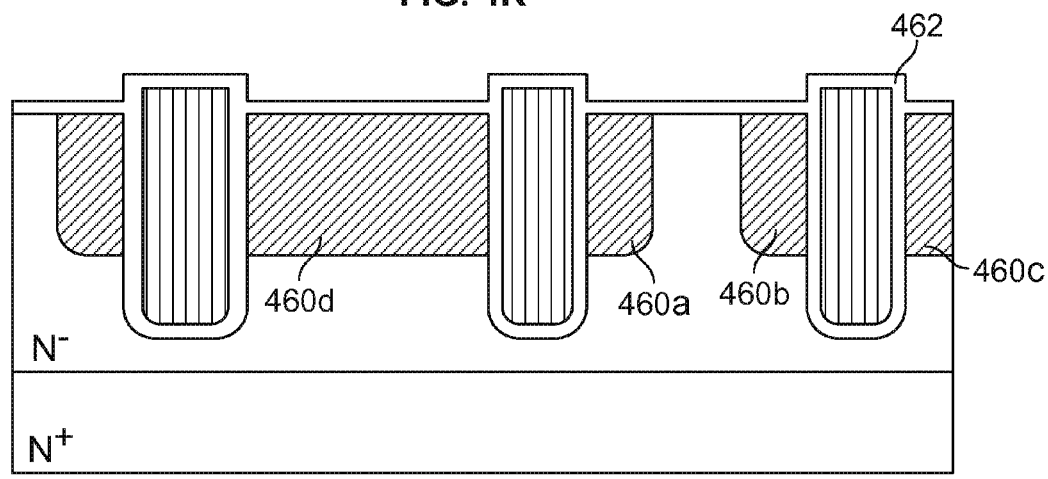

FIGS. 4K-4N illustrate the formation of the source and the body. In FIG. 4K, a photoresist layer 450 is patterned on the body surface using a body mask. The unmasked regions are implanted with body dopants. Dopants such as Boron ions are implanted. In some embodiments that are not shown here, the body implant is carried out without body block 450, forming a continuous body region between active trenches. In FIG. 4L, the photoresist is removed and the wafer is heated to thermally diffuse the implanted body dopants via a process sometimes referred to as body drive. Body regions 460a-d are then formed. In some embodiments, the energy used for implanting the body dopants is approximately between 30~600 keV, the dose is approximately between 5e12-4e13 ions/cm$^2$, and the resulting final body depth is approximately between 0.3-2.4 μm. Different depths can be achieved by varying factors including the implant energy, dose and diffusion temperature. An oxide layer 462 is formed during the diffusion process.

Figure 4M:
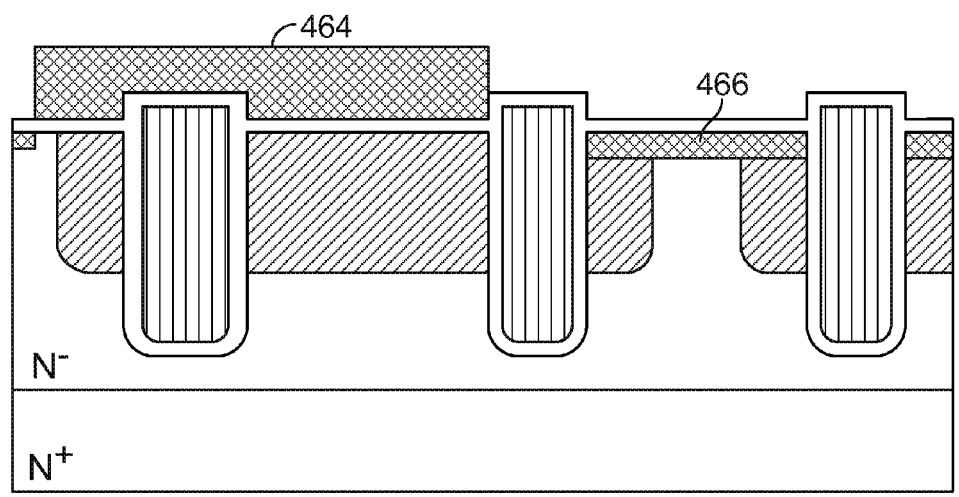
Figure 4N:
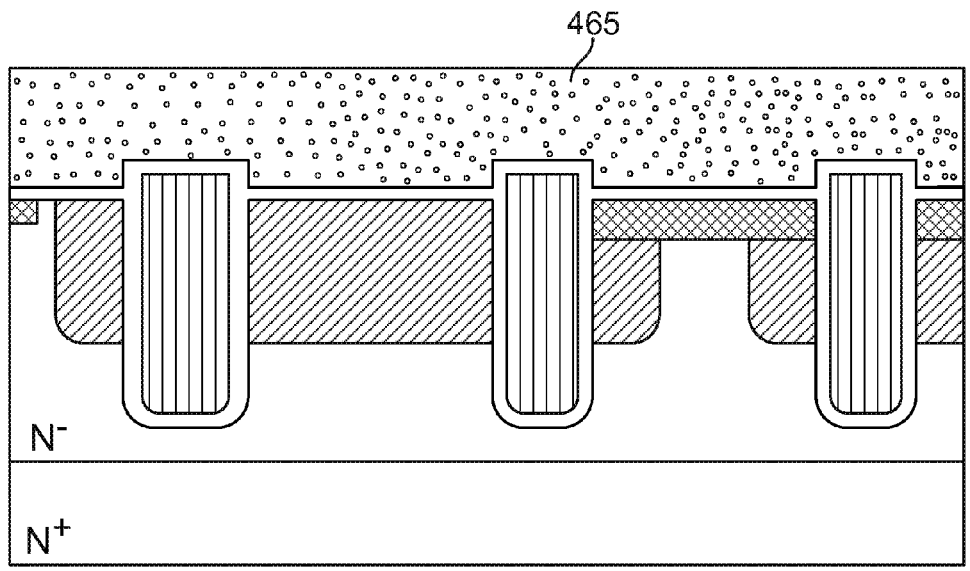

In FIG. 4M, a photoresist layer 464 is patterned using a source mask. In the embodiment shown, source mask 464 does not block any area between active trenches. In some embodiments, source mask 464 also blocks a center area of between active trenches (not shown). The unmasked region 466 is implanted with source dopants. In this example, arsenic ions penetrate the silicon in the unmasked areas to form N$^+$ type source. In some embodiments, the energy used for implanting the source dopants is approximately between 10~100 keV, the dose is approximately between 1e15-1e16 ions/cm$^2$, and the resulting source depth is approximately between 0.05-0.5 μm. Further depth reduction can be achieved by varying factors such as the doping energy and dose. Other implant processes may also be used as appropriate. In FIG. 4N, the photoresist is removed and the wafer is heated to thermally diffuse the implanted source dopants via a source drive process. A dielectric (e.g. BPSG) layer 465 is disposed on the top surface of the device after source drive, and optionally densified in some embodiments.

Figure 4O:
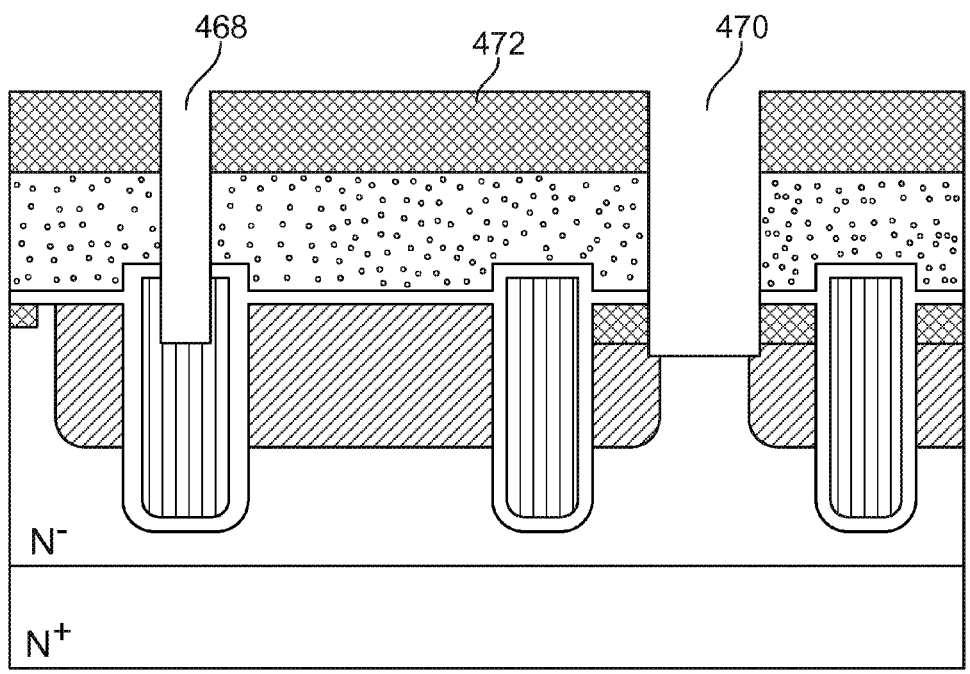

FIGS. 4O-4T illustrate the formation of the contact trench and various implants along the contact trench. In FIG. 4O, a photoresist layer 472 is deposited on the dielectric layer and patterned using a contact mask. A first contact etch is performed to form trenches 468 and 470. In some embodiments, the depth of the first contact trench is between 0.2-2.5 μm.

Figure 4P:
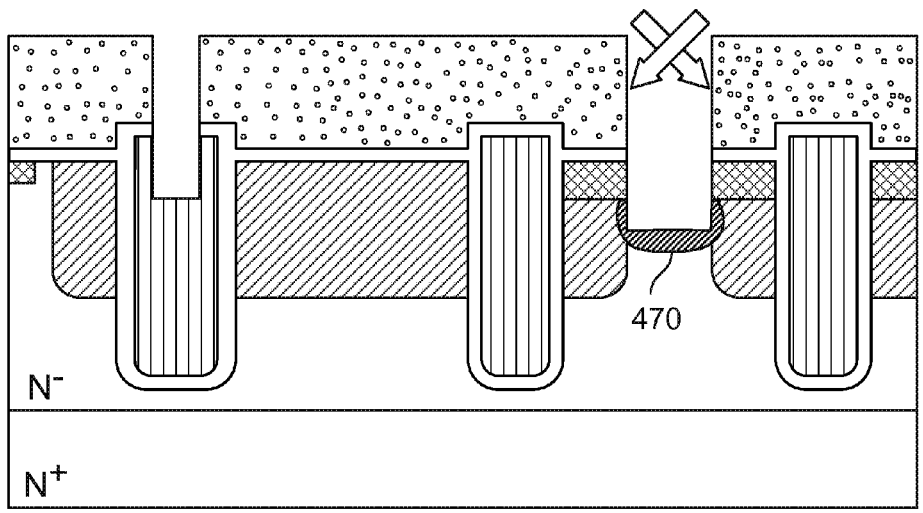
Figure 4Q:
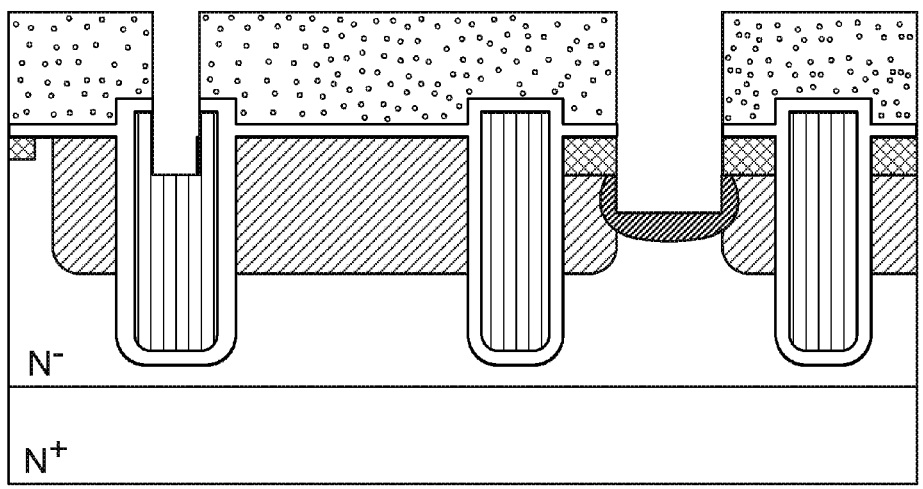

In FIG. 4P, the photoresist layer is removed, and the area around the bottom of trench 470 is bombarded with implant ions to form a punch-through prevention layer. Boron ions with a dose of approximately 1-5e15 ions/cm$^2$ are used in some embodiments. The implant energy is approximately 10-60 kEv. In some embodiments, BF$_2$ ions with a dose of approximately 1-5e15 ions/cm$^2$ and implant energy of 40-100 kEv are used. In some embodiments, both BF$_2$ and Boron are implanted to form the form the punch-through prevention layer. The implantation tilt is approximately between 0-45°. In FIG. 4Q, the implant is thermally diffused.

Figure 4R:
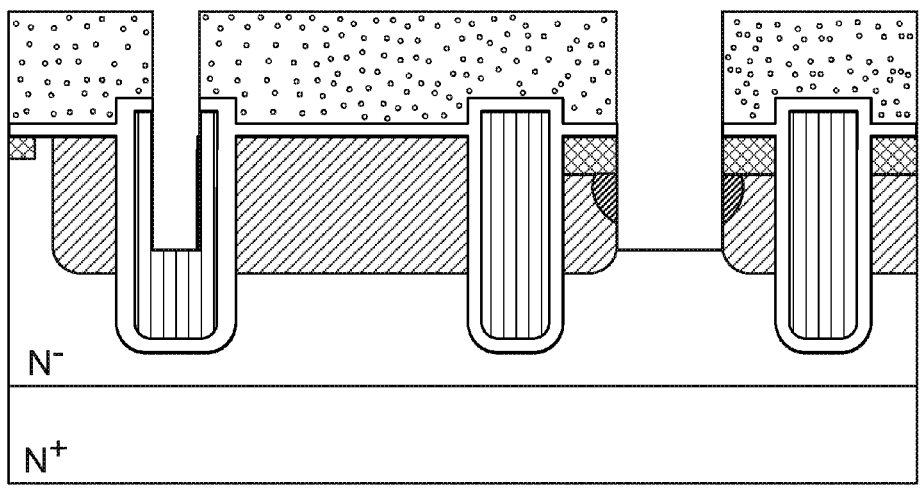
Figure 4S:
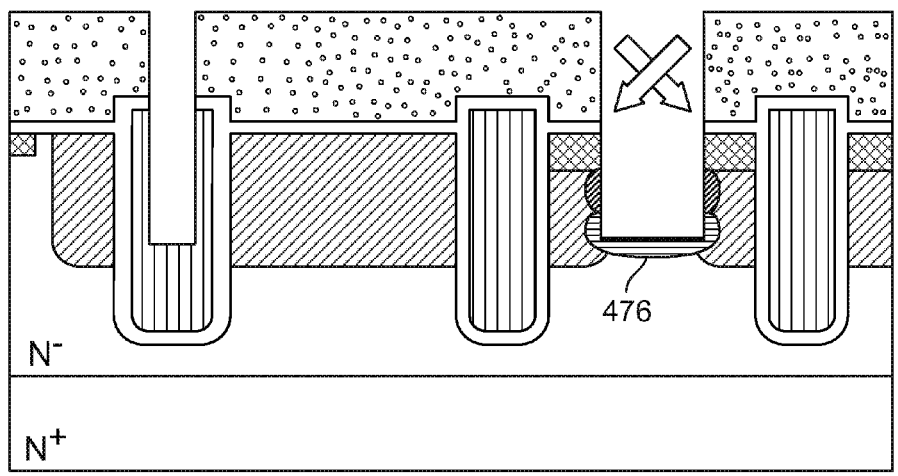
Figure 4T:
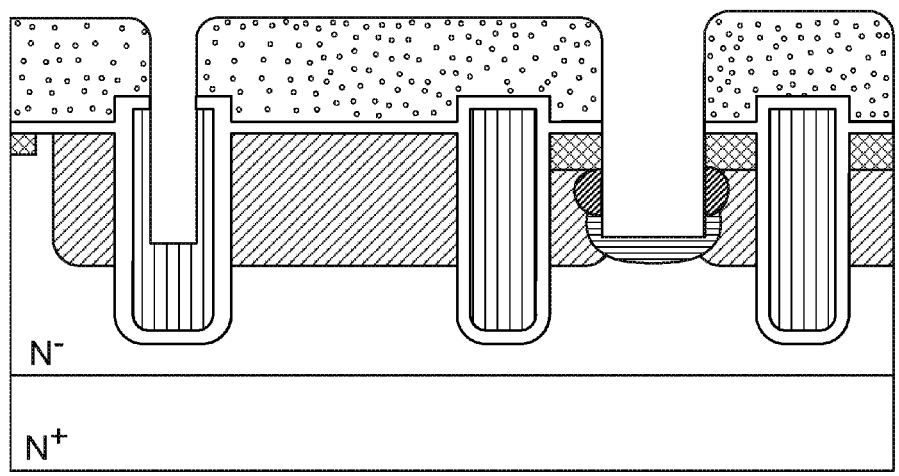

In FIG. 4R, a second contact etch takes place. Since the etching process does not affect the dielectric layer, the second contact etch does not require an extra mask. The depth of the trenches is increased by 0.2-0.5 μm in some embodiments. The punch-through prevention layer is etched through, leaving the anti-punch-through implants 474a-b along the trench wall. In FIG. 4S, a low dose shallow P type Schottky barrier controlling layer 476 is formed using ion implantation. In some embodiments, Boron or BF2 with a dosage between 2e11-3e13 ions/cm$^2$ and implant energy between 10-100 kEv are used. In FIG. 4T, the Schottky barrier controlling layer is activated by thermal diffusion. In comparison to the anti-punch through implant, the Schottky barrier controlling layer requires a lower dose and thus results in a lower doping and thinner layer of implant. In some embodiments, the Schottky barrier controlling layer is approximately 0.01~0.05 μm thick. The Schottky barrier controlling layer can adjust the barrier height because the implant adjusts the surface energy between the contact electrode and the semiconductor.

Figure 4U:
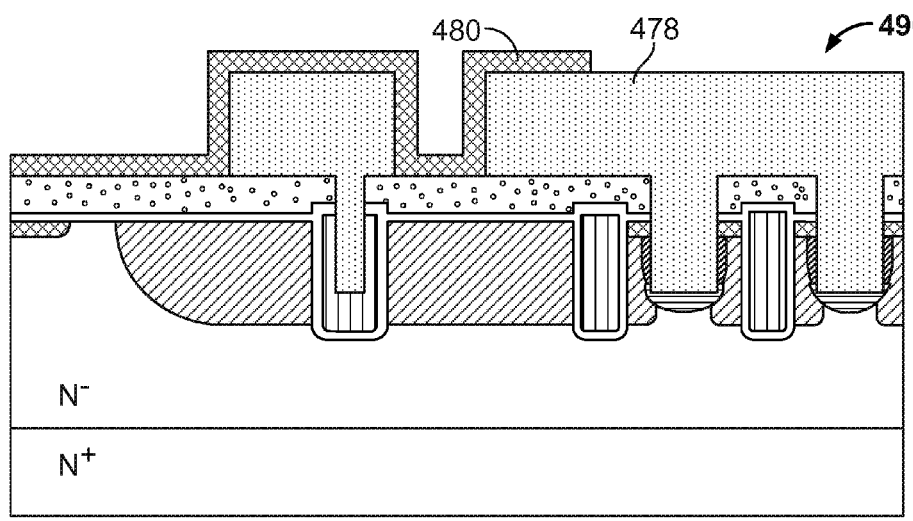
Figure 5A:
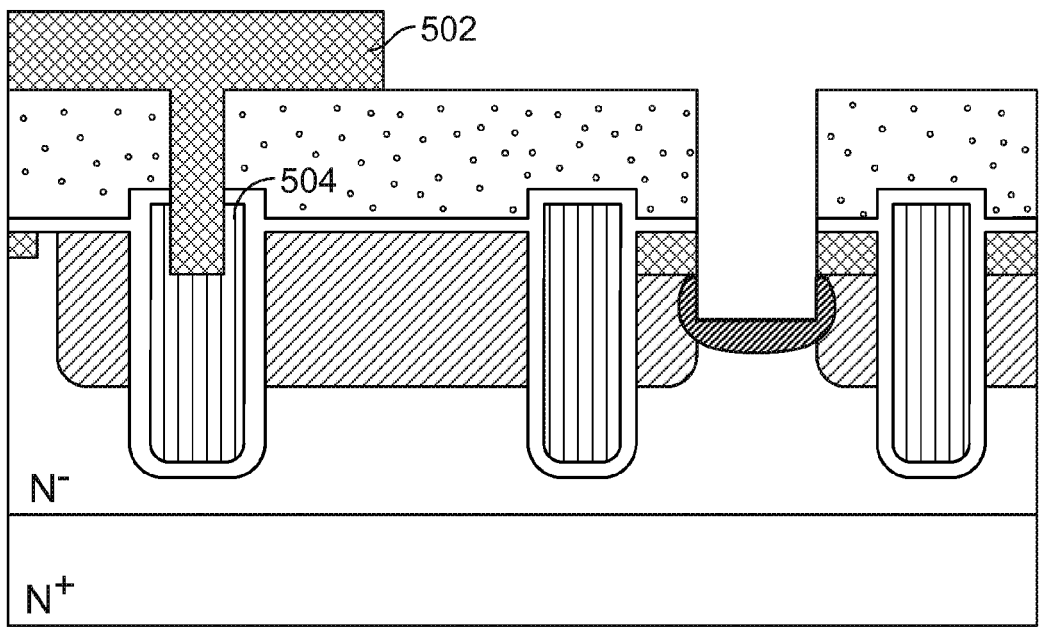
FIGS. 5A-6B illustrates additional alternative embodiments of fabrication steps.
Figure 5B:
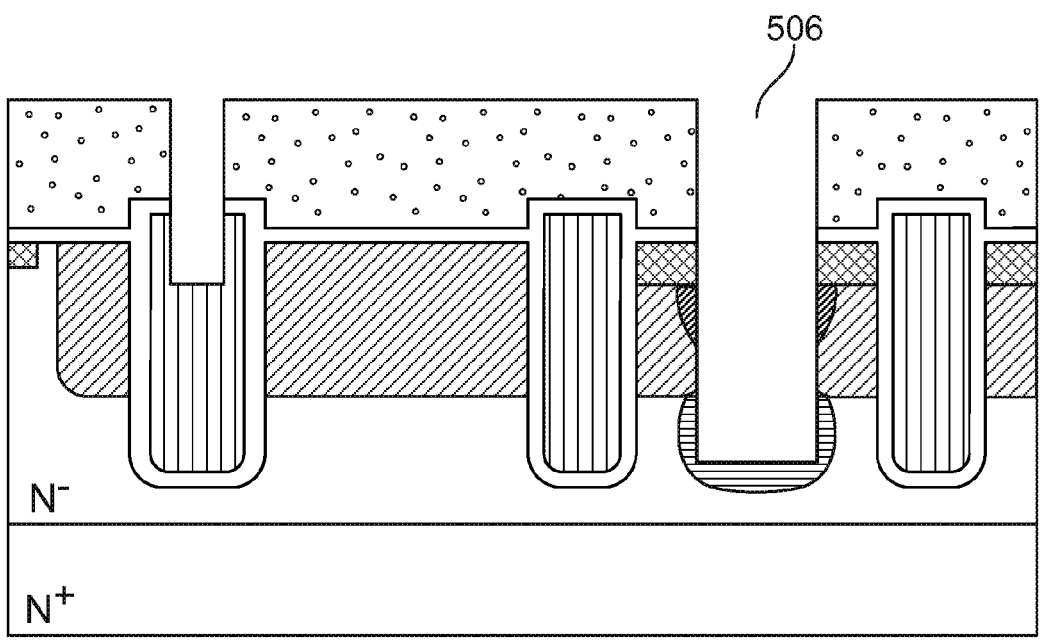

In FIG. 4U, completed device 490 is shown. Metal layer 478 is deposited, etched where appropriate, and annealed. Passivation openings are made after a passivation layer 480 is deposited. Additional steps required to complete the fabrication such as wafer grinding and back metal deposition are also performed.

Alternative processes may be used. For example, to fabricate devices 106-110 shown in FIGS. 1D-1F, the body implant process shown in FIG. 4K is modified and no body block in active area. Body dopants are directly implanted, blanketing the exposed areas and forming continuous body regions between gates. During contact etch, trenches are etched to a depth that is shallower than the bottom of the body region, leaving a body layer below the contact trench. Alternatively, active contact trench may be etched just through the body to expose epi drain region followed by an additional body dopant implant with well controlled energy and dopant to form a thin body layer through the contact trench sidewall and bottom.

In some embodiments, to form the Schottky barrier controlling layer, a narrow bandgap material such as SiGe is deposited by chemical vapor deposition (CVD) to form a layer on the top surface of an epitaxial layer. The thickness of narrow bandgap material layer is in the range from 100 Å to 1000 Å in some embodiments. For example, a 200 Å silicon rich SiGe layer is used in some embodiments. In some embodiments, the silicon rich SiGe layer comprises 80% Si and 20% Ge. In some embodiments, the narrow bandgap material layer is in-situ doped with N type dopant at a concentration between 2e17 to 2e18/cm$^3$. A low temperature oxide layer is then deposited over the narrow bandgap layer, and patterned to form a hard mask for dry etching trenches into the epitaxial layer. The hard mask protects portions of the narrow bandgap layer underneath during the dry etching process.

FIGS. 5A-6B illustrates additional alternative embodiments of fabrication steps. For example, FIG. 5A follows the punch-through prevention layer diffusion (see FIG. 4Q). A photoresist layer 502 is patterned using a second contact mask to block gate trench 504. In FIG. 5B, a second etch takes place to increase the depth of active region contact trench 506. The photoresist is then removed, and Schottky barrier controlling layer is implanted in a manner similar to FIGS. 4S and 4T. Additional finishing steps including metal deposition and passivation still apply (see FIG. 4U). The resulting device is similar to device 102 of FIG. 1B, where the gate trench has a different depth than the active region contact trench. By using a separate mask for the second contact trench etching to achieve different gate trench and active region contact trench depths, the gate trench contact can be made shallower and alleviate concerns over puncturing the gate poly during etching. Thus, the process is often used to fabricate devices with short gate polys, including embodiments with gate polys that do not extend above the substrate surface.

Figure 6A:
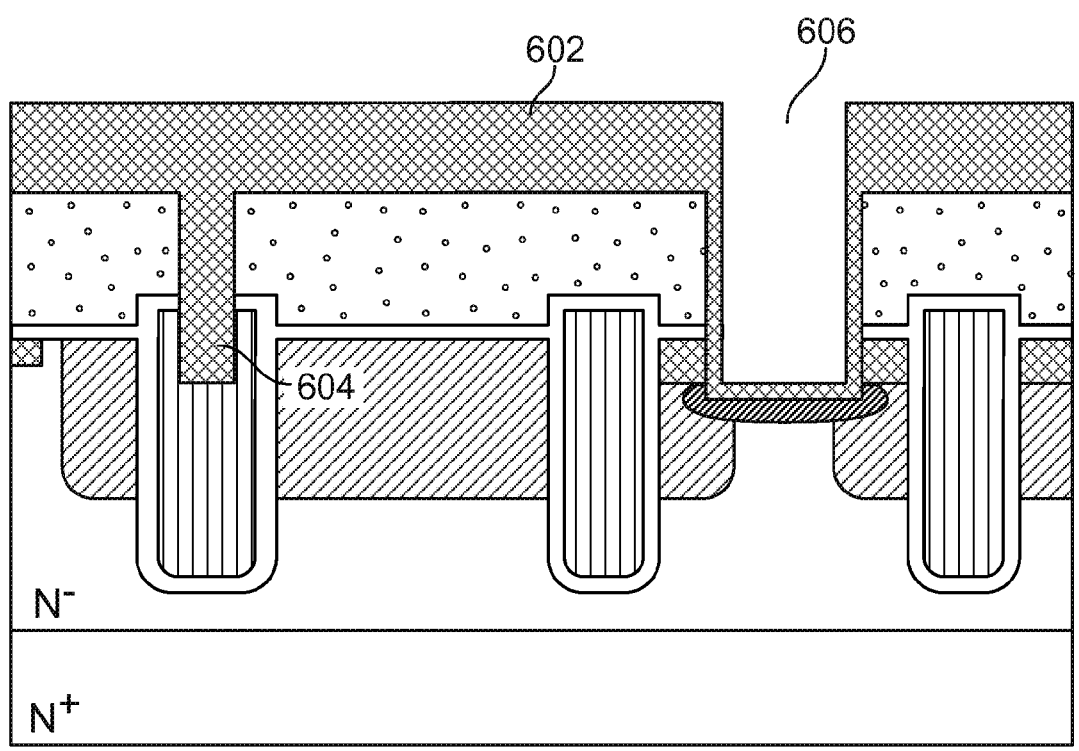
Figure 6B:
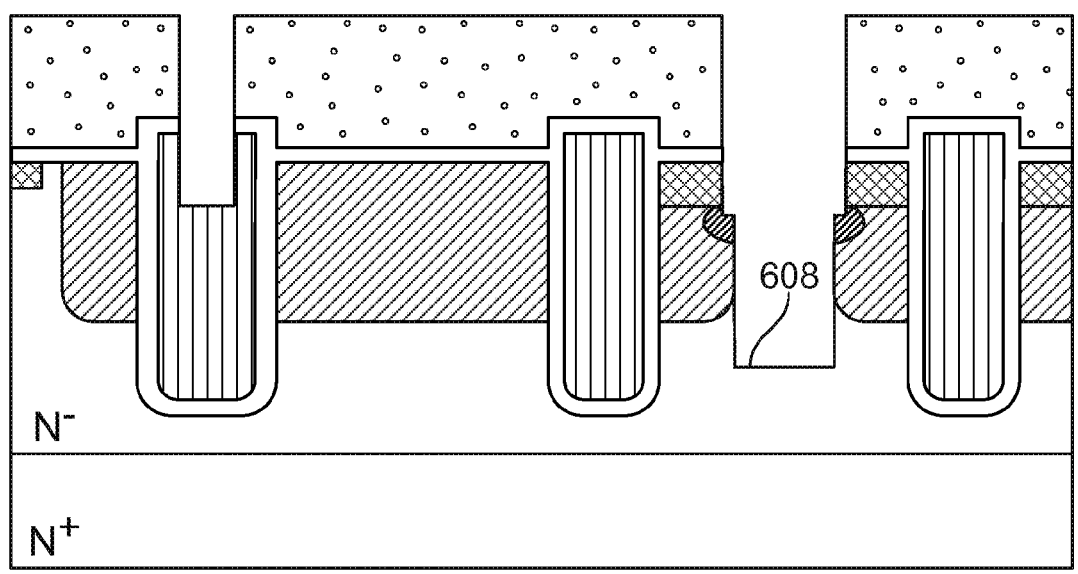

FIG. 6A also follows the punch-through prevention layer diffusion (see FIG. 4Q). A photoresist layer 602 is patterned using a second contact mask to block gate trench 604 and to form a contact opening over active region contact trench 606 that is smaller than the contact opening from the first etch. In FIG. 6B, a second contact etch is performed to form a deeper, narrower trench portion 608. The photo resist is removed and remaining steps from FIGS. 4S-4U apply. The resulting device is similar to 103 of FIG. 1C.

FIGS. 7-10 illustrate optional modifications to the fabrication process that are used in some embodiments to further enhance device performance.

Figure 7:
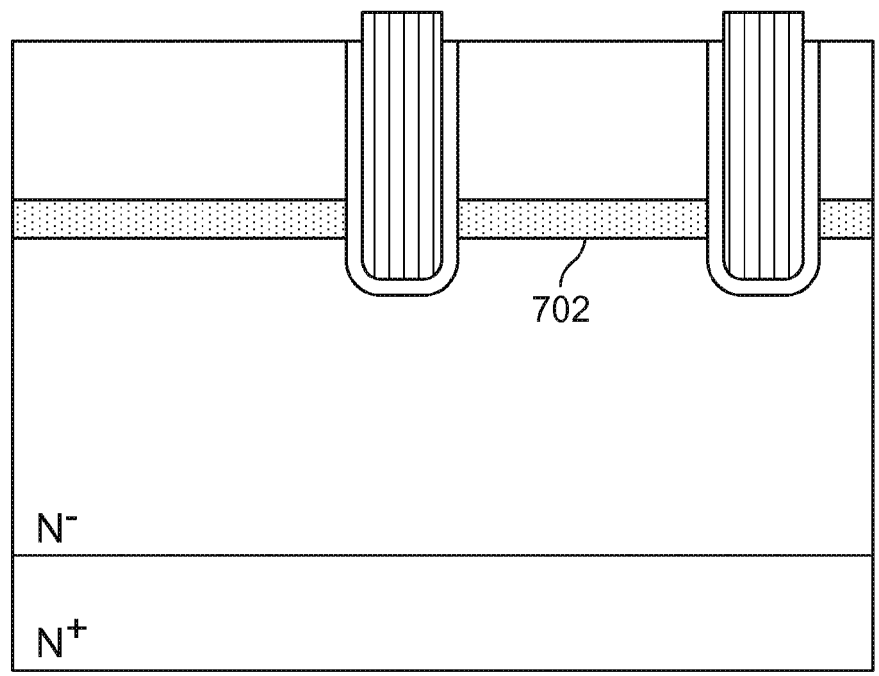
FIGS. 7-10 illustrate optional modifications to the fabrication process that are used in some embodiments to further enhance device performance.

The optional modification shown in FIG. 7 may take place after the gates have been formed (FIG. 4G) and prior to applying the body block mask (FIG. 4K). A blanket implant 702 having the opposite polarity as the epitaxial layer is deposited throughout the epi. In some embodiments, a high energy, low dose of Boron (5e11-1e13, 200-600 keV) is used to form blanket implant 702 before the formation of the main body implant. The blanket implant is used to adjust epi profile without resulting in polarity changing in the epi. The blanket implant changes the body profile in the body bottom region, and enhances the breakdown voltage without noticeably increasing $R_{dson}$.

Figure 8:
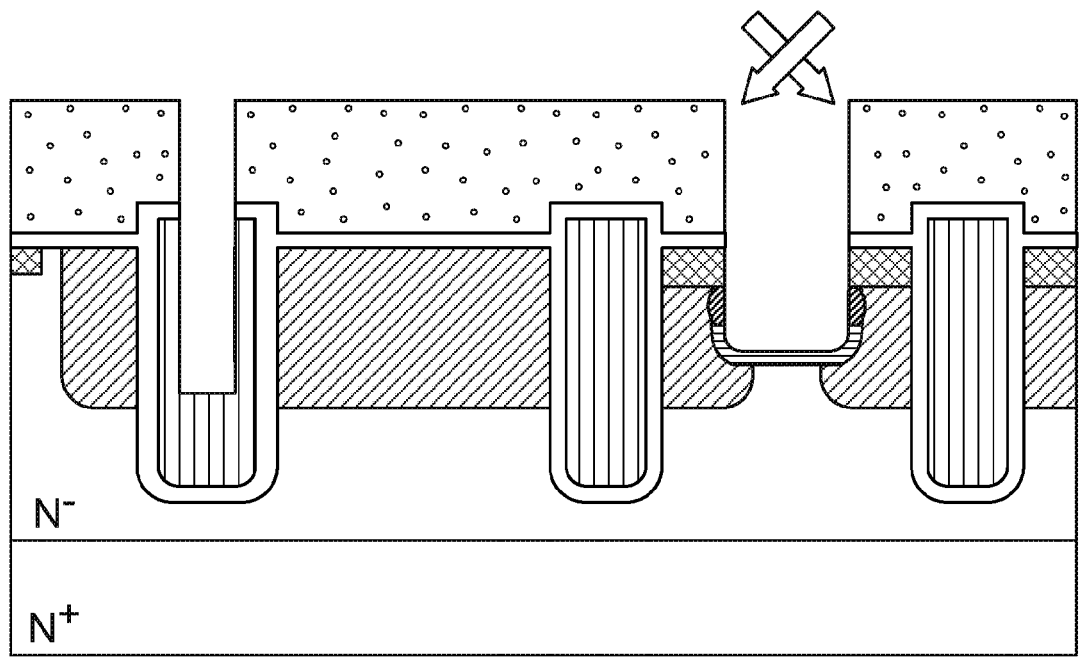

The optional modification shown in FIG. 8 may take place after the Shannon implant has been deposited (FIG. 4S) but prior to its activation (FIG. 4T). An epitaxial layer profile tuning implant is implanted under the active region contact trench. The epitaxial layer profile tuning implant has the opposite polarity as the epi. In some embodiments a high energy, low dose of Boron or $BF_2$ (e.g., 5e11~1e13, 60~300 keV) is used for the implant. The implant tunes the epi profile without changing the epi polarity, and enhances the breakdown voltage.

Figure 9:
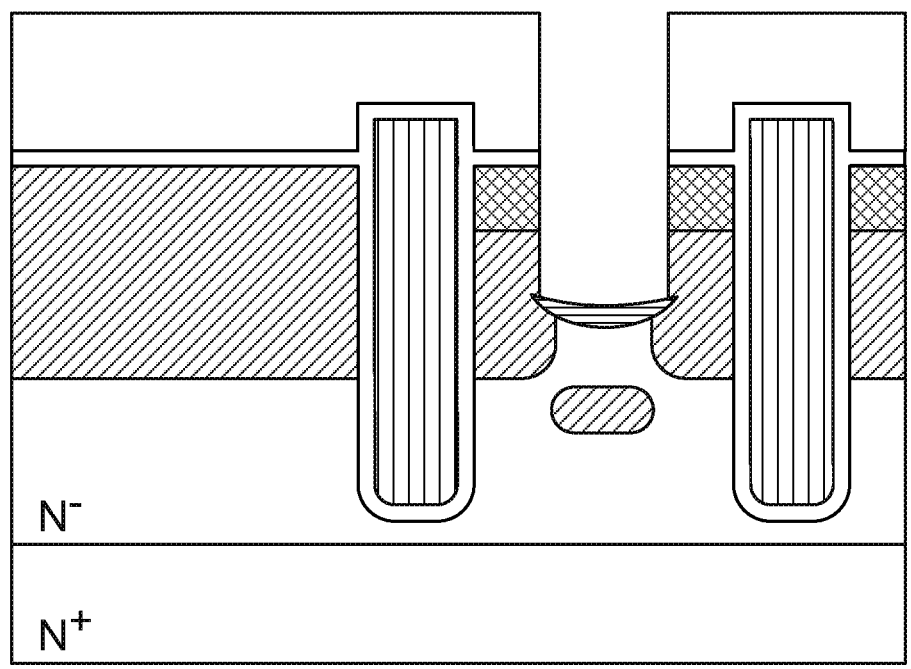

The optional modification shown in FIG. 9 may take place after the Shannon implant has been deposited (FIG. 4S) but prior to its activation (FIG. 4T). A high energy, medium dose of Boron (1e12~5e13, 60~300 keV) is implanted to form a P type island 902 that is located in the n-type epi under contact trench and disconnected from the body region. The floating P type island also enhances breakdown voltage.

Figure 10:
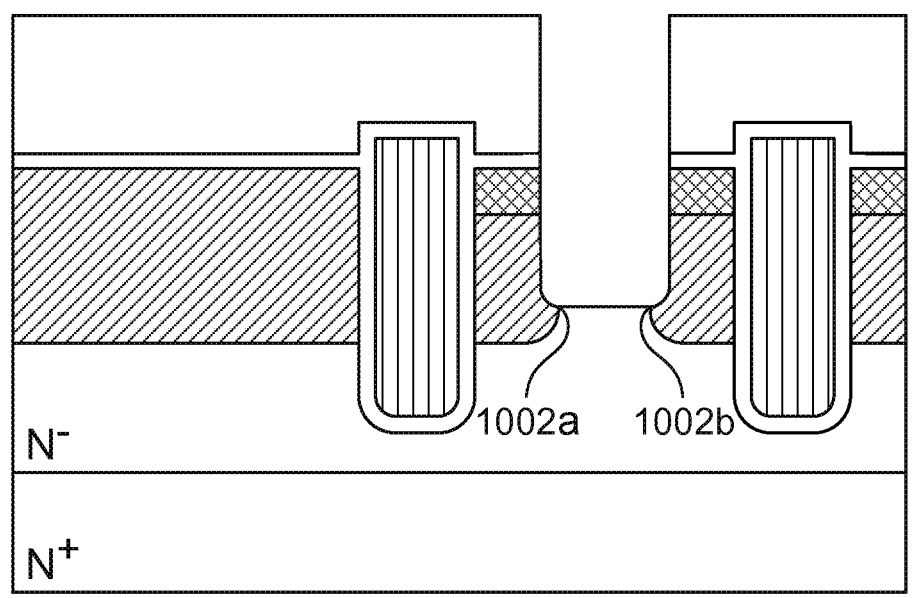

The optional modification shown in FIG. 10 may take place after the contact trench has been made (FIG. 4O) and prior to making the Shannon implant (FIG. 4P). Since sharp corners tend to accumulate electric charges, creates high electric fields, and lower breakdown voltage, corners of the trench bottom 1002a-b are rounded to reduce charge accumulation and improve breakdown voltage.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A semiconductor device formed on a semiconductor substrate, comprising:
   a drain;
   an epitaxial layer overlaying the drain, wherein a drain region extends into the epitaxial layer; and
   an active region comprising:
      a body disposed in the epitaxial layer, having a body top and a body bottom;
      a source embedded in the body, extending from the body top into the body;
      a gate trench extending into the epitaxial layer;
      a gate disposed in the gate trench;
      an active region contact trench extending through the source and into the body, having a active region contact trench bottom; and
      an active region contact electrode disposed within the active region contact trench;
   wherein:
      a layer of body region separates the active region contact electrode from the epitaxial layer;
      a thickness of the layer of body region is measured from the active region contact trench bottom to the body bottom;
      a depth of the active region contact trench is measured from a top surface of the semiconductor substrate to the active region contact trench bottom; and
      the thickness of the layer of body region is substantially less than the depth of the active region contact trench.

2. The semiconductor device of claim 1, wherein the layer of body region has a thickness range that is between 0.01~0.5 μm approximately.

3. The semiconductor device of claim 1, wherein the gate trench is a first gate trench; and
   the device further comprising a termination region comprising:
      a second gate trench extending into the epitaxial layer;
      a second gate disposed in the gate trench; and
      a gate contact trench formed within the second gate.

4. The semiconductor device of claim 3, wherein the gate contact trench and the active region contact trench have approximately the same depth.

5. The semiconductor device of claim 3, wherein the active region contact trench has a different depth than the gate contact trench.

6. The semiconductor device of claim 1, wherein the active region contact trench has a non-uniform depth.

7. The semiconductor device of claim 1, wherein:
   the active region contact trench has a first depth and a second depth;
   the first depth is shallower than the second depth; and
   a first contact opening corresponding to the first depth is wider than a second contact opening corresponding to the second depth.

8. The semiconductor device of claim 1, further comprising an anti-punch through implant disposed on a sidewall of the active region contact trench.

9. The semiconductor device of claim 1, further comprising a blanket implant deposited throughout the epitaxial layer, wherein the blanket implant has opposite polarity as the epitaxial layer.

10. The semiconductor device of claim 1, further comprising an epitaxial layer profile tuning implant deposited under the active region contact trench.

11. The semiconductor device of claim 1, wherein the gate extends above the body top.

12. The semiconductor device of claim 1, wherein the body and the semiconductor substrate have opposite polarities.

13. A method of fabricating a semiconductor device, comprising:
- forming a gate trench in an epitaxial layer overlaying a semiconductor substrate;
- depositing gate material in the gate trench;
- forming a body that has a body bottom;
- forming a source;
- forming an active region contact trench that extends through the source and into the body, wherein the active region contact trench is separated from the epitaxial layer by a layer of body region, and the active region contact trench has an active region contact trench bottom; and
- disposing a contact electrode within the active region contact trench;

wherein:
- a thickness of the layer of body region is measured from the active region contact trench bottom to the body bottom;
- a depth of the active region contact trench is measured from a top surface of the semiconductor substrate to the active region contact trench bottom; and
- the thickness of the layer of body region is substantially less than the depth of the active region contact trench.

14. The method of claim 13, wherein the gate trench is a first gate trench, and the method further comprising:
- forming a second gate trench that extends into the epitaxial layer;
- depositing gate material in the second gate trench; and
- forming a gate contact trench within the gate.

15. The method of claim 14, wherein the gate contact trench and the active region contact trench have approximately the same depth.

16. The method of claim 14, wherein the active region contact trench has a different depth than the gate contact trench.

17. The method of claim 13, wherein the active region contact trench has a depth that is non-uniform.

18. The method of claim 13, further comprising depositing an anti-punch through implant on a sidewall of the active region contact trench.

19. The method of claim 13, further comprising depositing a blanket implant throughout the epitaxial layer, wherein the blanket implant has opposite polarity as the epitaxial layer.

20. The method of claim 13, further comprising depositing an epitaxial layer profile tuning implant under the active region contact trench, wherein the epitaxial layer profile tuning implant does not change epitaxial layer polarity.

21. The method of claim 13, further comprising:
- forming a hard mask on the substrate prior to forming the gate trench;
- removing the hard mask to leave a gate structure that extends above the body top surface.

22. The method of claim 13, wherein the body and the semiconductor substrate have opposite polarities.

* * * * *